(12) United States Patent
Farrar (10) Patent No.: US 6,614,099 B2
(45) Date of Patent: Sep. 2, 2003

(54) COPPER METALLURGY IN INTEGRATED CIRCUITS

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/946,055

(22) Filed: Sep. 4, 2001

(65) Prior Publication Data

US 2002/0006725 A1 Jan. 17, 2002

Related U.S. Application Data (62) Division of application No. 09/128,859, filed on Aug. 4, 1998, now Pat. No. 6,284,656.

(51) Int. Cl.⁷ .......................... H01L 21/44; H01L 23/58
(52) U.S. Cl. ........................ 257/643; 257/762
(58) Field of Search ......................... 438/687, 623, 438/628; 257/642, 643, 762

(56) References Cited

U.S. PATENT DOCUMENTS

| | | | |
|---|---|---|---|
| 2,842,438 A | 7/1958 | Saarivirta et al. | 75/153 |
| 3,954,570 A | 5/1976 | Shirk et al. | 204/15 |
| 4,386,116 A | 5/1983 | Nair et al. | 427/99 |
| 4,423,547 A | 1/1984 | Farrar et al. | 29/571 |
| 4,565,157 A | 1/1986 | Brors et al. | 118/719 |
| 4,574,095 A | 3/1986 | Baum et al. | 427/53.1 |
| 4,762,728 A | 8/1988 | Keyser et al. | 427/38 |
| 4,788,082 A | 11/1988 | Schmitt | 427/248.1 |
| 4,847,111 A | 7/1989 | Chow et al. | 427/38 |
| 4,931,410 A | 6/1990 | Tokunaga et al. | 437/189 |
| 4,948,459 A | 8/1990 | Van Laarhoven et al. | 156/643 |
| 4,962,058 A | 10/1990 | Cronin et al. | 437/187 |
| 4,996,584 A | 2/1991 | Young et al. | 357/71 |
| 5,019,531 A | 5/1991 | Awaya et al. | 437/180 |
| 5,034,799 A | 7/1991 | Tomita et al. | 357/71 |
| 5,084,412 A | 1/1992 | Nakasaki | 437/189 |

(List continued on next page.)

FOREIGN PATENT DOCUMENTS

| | | | |
|---|---|---|---|
| JP | 5-267643 | 10/1993 | .......... H01L/29/46 |
| JP | 07-321111 | 8/1995 | ....... H01L/21/3205 |

OTHER PUBLICATIONS

In: *Kirk–Othmer Concise Encyclopedia of Chemical Technology,* Grayson, M., (ed.), John Wiley & Sons, Inc., New York, NY, p. 433–435, 926–938, (1985).

In: *Metals Handbook,* 8th Edition, vol. 8, ASM Handbook Committee, (eds.), American Society for Metals, Materials Park, OH, p. 300–302.

In: *Metals Handbook,* Ninth Edition, vol. 2, Properties and Selection: Nonferrous Alloys and Pure Metals, ASM Handbook Committee, (eds.), American Society for Metals, Metals Park, OH, 157, 395, (1989).

(List continued on next page.)

*Primary Examiner*—Wael Fahmy
*Assistant Examiner*—David S Blum
(74) *Attorney, Agent, or Firm*—Schwegman, Lundberg, Woessner & Kluth, P.A.

(57) ABSTRACT

A typical integrated circuit interconnects millions of microscopic transistors and resistors with aluminum wires buried in silicon-dioxide insulation. Yet, aluminum wires and silicon-dioxide insulation are less attractive than copper wires and polymer-based insulation, which promise both lower electrical resistance and capacitance and thus faster, more efficient circuits. Unfortunately, current techniques cannot realize the promise because copper reacts with the polymer-based insulation to form copper dioxide within the polymer, reducing effectiveness of the copper-polymer combination. Accordingly, the inventor devised a method which uses a non-acid-precursor to form a polymeric layer and then cures, or bakes, it in a non-oxidizing atmosphere, thereby making the layer resistant to copper-dioxidizing reactions. Afterward, the method applies a copper-adhesion material, such as zirconium, to the layer to promote adhesion with a subsequent copper layer. With reduced copper-dioxide, the resulting interconnective structure facilitates integrated circuits with better speed and efficiency.

25 Claims, 4 Drawing Sheets

U.S. PATENT DOCUMENTS

| | | | |
|---|---|---|---|
| 5,100,499 A | 3/1992 | Douglas | 156/635 |
| 5,130,274 A | 7/1992 | Harper et al. | 437/195 |
| 5,149,615 A | 9/1992 | Chakravorty et al. | 430/313 |
| 5,158,986 A | 10/1992 | Cha et al. | 521/82 |
| 5,173,442 A | 12/1992 | Carey | 437/173 |
| 5,231,056 A | 7/1993 | Sandhu | 437/200 |
| 5,240,878 A | 8/1993 | Fitzsimmons et al. | 437/187 |
| 5,243,222 A | 9/1993 | Harper et al. | 257/774 |
| 5,256,205 A | 10/1993 | Schmitt, III et al. | 118/723 |
| 5,334,356 A | 8/1994 | Baldwin et al. | 422/133 |
| 5,354,712 A | 10/1994 | Ho et al. | 437/195 |
| 5,413,687 A | 5/1995 | Barton et al. | 204/192.14 |
| 5,426,330 A | 6/1995 | Joshi et al. | 257/752 |
| 5,442,237 A | 8/1995 | Hughes et al. | 257/759 |
| 5,447,887 A | 9/1995 | Filipiak et al. | 437/200 |
| 5,470,789 A | 11/1995 | Misawa | 437/190 |
| 5,470,801 A | 11/1995 | Kapoor et al. | 437/238 |
| 5,476,817 A | 12/1995 | Numata | 437/195 |
| 5,506,449 A | 4/1996 | Nakano et al. | 257/758 |
| 5,529,956 A | 6/1996 | Morishita | 437/195 |
| 5,538,922 A | 7/1996 | Cooper et al. | 437/195 |
| 5,539,060 A | 7/1996 | Tsunogae et al. | 525/338 |
| 5,595,937 A | 1/1997 | Mikagi | 437/192 |
| 5,609,721 A | 3/1997 | Tsukune et al. | 156/646.1 |
| 5,625,232 A | 4/1997 | Numata et al. | 257/758 |
| 5,635,253 A | 6/1997 | Canaperi et al. | 427/437 |
| 5,654,245 A | 8/1997 | Allen | 438/629 |
| 5,662,788 A | 9/1997 | Sandhu et al. | 205/87 |
| 5,670,420 A | 9/1997 | Choi | 437/189 |
| 5,674,787 A | 10/1997 | Zhao et al. | 437/230 |
| 5,675,187 A | 10/1997 | Numata et al. | 257/758 |
| 5,679,608 A | 10/1997 | Cheung et al. | 437/195 |
| 5,681,441 A | 10/1997 | Svendsen et al. | 205/114 |
| 5,695,810 A | 12/1997 | Dubin et al. | 427/96 |
| 5,719,089 A | 2/1998 | Cherng et al. | 438/637 |
| 5,731,042 A | 3/1998 | Glende et al. | 437/194 |
| 5,739,579 A | 4/1998 | Chiang et al. | 257/635 |
| 5,763,953 A | 6/1998 | Iljima et al. | 257/762 |
| 5,780,358 A | 7/1998 | Zhou | 438/645 |
| 5,785,570 A | 7/1998 | Bruni | 445/52 |
| 5,792,522 A | 8/1998 | Jin et al. | 427/575 |
| 5,801,098 A | 9/1998 | Fiordalice et al. | 438/653 |
| 5,824,599 A | 10/1998 | Schacham-Diamand et al. | 438/678 |
| 5,891,797 A | 4/1999 | Farrar | 438/619 |
| 5,891,804 A | 4/1999 | Havemann et al. | 438/674 |
| 5,893,752 A | 4/1999 | Zhang et al. | 438/687 |
| 5,895,740 A | 4/1999 | Chien et al. | 430/313 |
| 5,897,370 A | 4/1999 | Joshi et al. | 438/632 |
| 5,907,772 A | 5/1999 | Iwasaki | 438/253 |
| 5,911,113 A | 6/1999 | Yao et al. | 438/649 |
| 5,913,147 A | 6/1999 | Dubin et al. | 438/687 |
| 5,932,928 A | 8/1999 | Clampitt | 257/758 |
| 5,933,758 A | 8/1999 | Jain | 438/687 |
| 5,948,467 A | 9/1999 | Nguyen et al. | 427/99 |
| 5,962,923 A | 10/1999 | Xu et al. | 257/774 |
| 5,968,333 A | 10/1999 | Nogami et al. | 205/184 |
| 5,969,422 A | 10/1999 | Ting et al. | 257/762 |
| 5,972,179 A | 10/1999 | Chittipeddi et al. | 204/192.17 |
| 5,972,804 A | 10/1999 | Tobin et al. | 438/786 |
| 5,976,710 A | 11/1999 | Sachdev et al. | 428/620 |
| 5,981,350 A | 11/1999 | Geusic et al. | 438/386 |
| 5,985,759 A | 11/1999 | Kim et al. | 438/653 |
| 5,989,623 A | 11/1999 | Chen et al. | 427/97 |
| 5,994,777 A | 11/1999 | Farrar | 257/758 |
| 6,008,117 A | 12/1999 | Hong et al. | 438/629 |
| 6,015,465 A | 1/2000 | Kholodenko et al. | 118/719 |
| 6,017,820 A | 1/2000 | Ting et al. | 438/689 |
| 6,030,877 A | 2/2000 | Lee et al. | 438/381 |
| 6,054,172 A | 4/2000 | Robinson et al. | 427/97 |
| 6,065,424 A | 5/2000 | Shacham-Diamond et al. | 118/696 |
| 6,069,068 A | 5/2000 | Rathore et al. | 438/628 |
| 6,071,810 A | 6/2000 | Wada et al. | 438/635 |
| 6,091,136 A | 7/2000 | Jiang et al. | 257/676 |
| 6,136,095 A | 10/2000 | Xu et al. | 118/719 |
| 6,139,699 A | 10/2000 | Chiang et al. | 204/192.15 |
| 6,140,228 A | 10/2000 | Shan et al. | 438/653 |
| 6,143,646 A | 11/2000 | Wetzel | 438/637 |
| 6,153,507 A | 11/2000 | Mikagi | 438/618 |
| 6,171,661 B1 | 1/2001 | Zheng et al. | 427/535 |
| 6,177,350 B1 | 1/2001 | Sundarrajan et al. | 438/688 |
| 6,183,564 B1 | 2/2001 | Reynolds et al. | 118/719 |
| 6,190,732 B1 | 2/2001 | Omstead et al. | 118/729 |
| 6,197,688 B1 | 3/2001 | Simpson | 438/678 |
| 6,207,222 B1 | 3/2001 | Chen et al. | 427/97 |
| 6,208,016 B1 | 3/2001 | Farrar | 257/643 |
| 6,211,049 B1 | 4/2001 | Farrar | 438/597 |
| 6,211,073 B1 | 4/2001 | Ahn et al. | 438/653 |
| 6,232,219 B1 | 5/2001 | Blalock et al. | 438/637 |
| 6,249,056 B1 | 6/2001 | Kwon et al. | 257/758 |
| 6,265,311 B1 | 7/2001 | Hautala et al. | 438/680 |
| 6,271,592 B1 | 8/2001 | Kim et al. | 257/751 |
| 6,284,656 B1 | 9/2001 | Farrar | 438/687 |
| 6,288,442 B1 | 9/2001 | Farrar | 257/678 |
| 6,323,543 B1 | 11/2001 | Jiang et al. | 257/676 |
| 6,372,622 B1 | 4/2002 | Tan et al. | 438/612 |

OTHER PUBLICATIONS

"Brooks Model 5964 High Performance Metal Seal Mass Flow Controller (Introduced in 1991)", Brooks Instrument, http://www.frco.com/brooks/semiconductor/products-li.html, 1 page, (1991).

Abe, K., et al., "Sub–half Micron Copper Interconnects Using Reflow of Sputtered Copper Films", *VLSI Multilevel Interconnection Conference*, 308–311, (Jun. 25–27, 1995).

Andricacos, P.C., "Copper On–Chip Interconnections", *The Electrochemical Society Interface*, pp. 32–37, (1999).

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract, 1 p., (Jul. 10, 1988).

Anonymous, "Improved Metallurgy for Wiring Very Large Scale Integrated Circuits", *International Technology Disclosures*, 4, Abstract, 1 page, (1986).

Bae, S., et al., "Low–Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, p. 315, (1997).

Bai, G., et al., "Copper Interconnection Deposition Techniques and Integration", *1996 Symposium on VLSI Technology*, Digest of Technical Papers, 48–49, (1996).

Bernier, M., et al., "Laser processing of palladium for selective electroless copper plating", *SPIE*, 2045, pp. 330–337, (1994).

Bhansali, S., et al., "A novel technique for fabrication of metallic structures on polymide by selective electroless copper plating using ion implantation", *Thin Solid Films*, 270, No. 1/02, pp. 489–492, (1995).

Bhansali, S., et al., "Selective electroless copper plating on silicon seeded by copper ion implantation", *Thin Solid Films*, 253, pp. 391–394, (1994).

Braud, E., et al., "Ultra Thin Diffusion Barriers for Cu Interconnections at The Gigabit Generation and Beyond", *VMIC Conference Proceedings*, pp. 174–179, (1996).

Cabrera, A.L., et al., "Oxidation protection for a variety of transition metals and copper via surface silicides formed with silane containing atmospheres", *J. Mater. Res.*, 6(1), pp. 71–79, (1991).

Chakravorty, K.K., et al., "High–Density Interconnection Using Photosensitive Polyimide and Electroplated Copper Conductor Lines", *IEEE Transactions on Components, Hybrids, and Manufacturing Technology*, 13(1), pp. 200–206, (Mar. 1990).

Craig, J.D., "Polymide Coatings", In: *Packaging, Electronic Materials Handbook*, vol. 1, ASM International Handbook Committee (eds.), ASM International, Materials Park, OH, 767–772, (1989).

de Felipe, T.S., et al., "Electrical Stability and Microstructural Evolution in Thin Films of High Conductivity Copper Alloys", *IEEE*, pp. 293–295, (1999).

Ding, et al., "Copper Barrier, Seed Layer and Planerization Technologies", *VMIC Conference Proceedings*, pp. 87–92, (1997).

Dubin, V.M., et al., "Selective and Blanket Electroless Copper Deposition for Ultralarge Scale Integration", *J. Electrochem. Soc.*, 144(3), pp. 898–908, (1997).

Dushman, S., et al., *Scientific Foundations of Vacuum Technique*, 2nd Edition, John Wiley and Sons, 1–806, (1962).

Edelstein, D., et al., "Full Copper Wiring in a Sub–0.25 micrometer CMOS ULSI Technology", *IEDM*, pp. 773–776, (1997).

Eldridge, J.M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN, pp. 283–285, (1987).

Ernst, et al., "Growth Model for Metal Films on Oxide Surface: Cu on ZnO(0001)–O", *Physical Review B*, 47, 13782–13796, (May 15, 1993).

Gladlfelter, W.L., et al., "Trimethylamine Complexes of Alane as Precursors for the Low–Pressure Chemical Vapor Deposition of Aluminum", *Chemistry of Materials*, 1, pp. 339–343, (1989).

Godbey, D.J., et al., "Copper Diffusion in Organic Polymer Resists and Inter–level Dielectrics", *Thin Solid Films*, 308–309, pp. 470–474, (1997).

Grimblot, J., et al., "II. Oxidation of Aluminum Films", *J. Electrochem.*, 129, pp. 2369–2372, (1982).

Hattangady, S.V., et al., "Integrated processing of silicon oxynitride films by combined plasma and rapid–thermal processing", *J. Vac. Sci. Technol. A*, 14(6), pp. 3017–3023, (1996).

Hirao, S., et al., "A Novel Copper Reflow Process Using Dual Wetting Layers", *1997 Symposium on VLSI Technology*, Digest of Technical Papers, 57–58, (1997).

Hirata, A., et al., "WSiN Diffusion Barrier Formed by ECR Plasma Nitridation for Copper Damascene Interconnection", *16th Solid State Devices and Materials*, pp. 260–261, (1998).

Holloway, K., et al., "Tantalum as a diffusion barrier between copper and silicon", *Appl. Phys. Lett.*, 57(17), pp. 1736–1738, (Oct. 1990).

Hu, C.K., et al., "Extendibility of Cu Damascene to 0.1 micrometer Wide Interconnections", *Mat. Res. Soc. Symp. Proc*, 514, pp. 287–292, (1998).

Hymes, S., et al., "Passivation of Copper by Silicide Formation in Dilute Silane", *Conference Proceedings ULSI–VII*, pp. 425–431, (1992).

Iijima, T., et al., "Microstructure and Electrical Properties of Amorphous W–Si–N Barrier Layer for Cu Interconnections", *1996 VMIC Conference*, pp. 168–173, (1996).

Izaki, M., et al., "Characterization of Transparent Zinc Oxide Films Prepared by Electrochemical Reaction", *Journal of the Electrochemical Society*, 144, 1949–1952, (Jun. 1997).

Jayaraj, K., et al., "Low Dielectric Constant Microcellular Foams", *Proceedings from the Seventh Meeting of the DuPont Symposium on Polymides in Microelectrics*, pp. 474–501, (Sep. 1996).

Jeon, Y., et al., "Low–Temperature Fabrication of Polycrystalline Silicon Thin Films by ECR Pecvd", *The Electrochemical Society Proceedings*, 94(35), pp. 103–114, (1995).

Jin, C., et al., "Porous Xerogel Films as Ultra–low Permittivity Dielectrics for ULSI Interconnect Applications", *Conference Proceedings ULSI XII—1997 Materials Research Society*, pp. 463–469, (1997).

Kamins, T.I., "Structure and Properties of LPCVD Silicon Films", *J. Electrochem. Soc.: Solid–State Science and Technology*, 127, pp. 686–690, (Mar. 1980).

Kang, H.K., et al., "Grain Structure and Electromigration Properties of CVDCU Metallization", *Proceedings of the 10th International VLSI Multilevel Interconnection Conference*, 223–229, (Jun. 8–9, 1993).

Keppner, H., et al., "The "Micromorph" Cell: A New Way to High–Efficiency–Low–Temperature Crystalline Silicon Thin–Film Cell Manufacturing", *Mat. Res. Soc. Symp. Proc.*, 452, pp. 865–876, (1997).

Kiang, M., et al., "Pd/Si plasma immersion ion implantation for selective electrless copper plating on Sio2", *Appl. Phys. Lett.*, 60, pp. 2767–2769, (1992).

Kistiakowsky, G.B., et al., "Reactions of Nitrogen Atoms. I. Oxygen and Oxides of Nitrogen", *The Journal of Chemical Physics*, 27(5), pp. 1141–1149, (1957).

Laursen, T., et al., "Encapsulation of Copper by Nitridation of Cu–Ti Alloy/Bilayer Structures", *International Conference on Metallurgical Coatings and Thin Films*, Abstract No. H1.03, San Diego, CA, p. 309, (Apr. 1997).

Len, V., et al., "An investigation into the performance of diffusion barrier materials against copper diffusion using metal–oxide–semiconductor (MOS) capacitor structures", *Solid–State Electronics*, 43, pp. 1045–1049, (1999).

Lyman, T., et al., "Metallography, Structures and Phase Diagrams", *Metals Handbook*, 8, American Society for Metals, Metals Park, Ohio, pp. 300 & 302, (1989).

Marcadal, C., et al., "OMCVD Copper Process for Dual Damascene Metallization", *VMIC Conference*, ISMIC, pp. 93–97, (1997).

Miller, R.D., et al., "Low Dielectric Constant Polyimides and Polyimide Nanofoams", *Seventh Meeting of the DuPont Symposium on Polymides in Microelectronics*, pp. 443–473, (Sep. 1996).

Miyake, T., et al., "Atomic Hydrogen Enhanced Reflow of Copper", *Applied Physics Letters*, 70, 1239–1241, (1997).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE*, 2335, pp. 80–90, (1994).

Nakao, S., et al., "Thin and Low–Resistivity Tantalum Nitride Diffusion Barrier and Giant–Grain Copper Interconnects for Advanced ULSI Metallization", *Japanese Journal of Applied Physics,* 38(4B), pp. 262–263, (Apr. 1999).

Newboe, B., et al., "Applied Materials Announces First Barrier/Seed Layer System For Copper Interconnects", *Applied Materials,* http://www.appliedmaterials.com/newsroom/pr–00103.html, pp. 1–4, (1997).

Okamoto, Y., et al., "Magnetically Excited PLasma Oxynitridation of Si at Room Temperature", *Jpn. J. Appl. Phys.,* 34, pp. L955–L957, (1995).

Palleau, J., et al., "Refractory Metal Encapsulation in Copper Wiring", *Advanced Metallization for Devices and Circuits–Science, Technology and Manufacturability, Materials Research Society Symposium Proceedings,* 337, pp. 225–231, (Apr. 1994).

Park, C.W., et al., "Activation Energy for Electromigration in Cu Films", *Applied Physics Letters,* 59(, 175–177, (Jul. 6, 1991).

Radzimski, Z.J., et al., "Directional Copper Deposition using d–c Magnetron Self–sputtering", *J. Vac. Sci. Technol. B,* 16(3), pp. 1102–1106, (1998).

Ramos, T., et al., "Nanoporous Silica for Dielectric Constant Less Than 2", *Conference Proceedings ULSI XII—1997 Materials Research Society,* 455–461, (1997).

Rath, J.K., et al., "Low–Temperature deposition of polycrystalline silicon thin films by hot–wire CVD", *Solar Energy Materials and Solar Cells,* 48, pp. 269–277, (1997).

Ray, S.K., et al., "Flourine–enhanced nitridation of silicon at low temperatures in a microwave plasma", *J. Appl. Phys.,* 70(3), pp. 1874–1876, (1991).

Rossnagel, S.M., "Magnetron Sputter Deposition of Interconnect Applications", *Conference Proceedings, ULSI XI,* 227–232, (1996).

Rossnagel, S.M., et al., "Metal ion deposition from ionized mangetron sputtering discharge", *J. Vac. Sci. Technol. B,* 12(1), pp. 449–453, (1994).

Ryan, J.G., et al., "Copper Interconnects for Advanced Logic and DRAM", Extended Abstracts of the 1998 International Conference on Solid–State Devices and Materials, Hiroshima, pp. 258–259, (1998).

Ryu, C., et al., "Barriers for copper interconnections", *Solid State Technology,* pp. 53,54,56, (Apr. 1999).

Saarivirta, M.J., "High Conductivity Copper Rich Cu–Zr Alloys", *Transactions of the Metallurgical Society of AIME,* 218, pp. 431–437, (1960).

Senzaki, Y., "Chemical Vapor Deposition of Copper using a New Liquid Precursor with Improved Thermal Stability", *Conference Proceedings ULSI XIII, Materials Research Society,* pp. 451–455, (1998).

Shacham–Diamand, Y., "100 nm Wide Copper Lines Made by Selective Electroless Deposition", *Journal of Micromechanics and Microengineering,* 1, 66–72, (Mar. 1991).

Shacham–Diamand, Y., et al., "Copper electroless deposition technology for ultra–large–scale–integration (ULSI) metallization", *Microelectronic Engineering,* NL, vol. 33, No. 1, XP004054497, 47–58, (1997).

Shacham–Diamond, Y., et al., "Copper electroless deposition technology for ultra–large–scale–integration (USLI) metallization", *Microelectronic Engineering,* 33, pp. 47–58, (1997).

Srivatsa, A.R., et al., "Jet Vapor Deposition: an Alternative to Electrodeposition", *Surface Engineering,* 11, 75–77, (1995).

Stroud, P.T., et al., "Preferential deposition of silver induced by low energy gold ion implantation", *Thin Solid Films,* Switzerland, vol. 9, No. 2, XP000993098, 273–281, (Feb. 1972).

Tao, J., et al., "Electromigration Characteristics of Copper Interconnects", *IEEE Electron Devices Letters,* 14, 249–251, (May 1993).

Ting, C.H., "Methods and Needs for Low K Material Research", *Materials Research Society Symposium Proceedings,* vol. 381, Low–Dielectric Constant Materials—Synthesis and Applications in Microelectronics, Lu, T.M., et al., (eds.), San Francisco, CA, 3–17, (Apr. 17–19, 1995).

Tsukada, T., et al., "Adhesion of copper films on ABS polymers deposited in an internal magnet magnetron sputtering system", *J. Vac. Sci. Technol.,* 16(2), 348–351, (1979).

Van Vlack, L.H., *Elements of Materials Science,* Addison––Wesley Publishing Co., Inc. Reading, MA, p. 468, (1959).

Venkatesan, S., et al., "A High Performance 1.8V, 0.20 micrometer CMOS Technology with Copper Metalization", *IEEE,* pp. 769–772, (1997).

Vossen, J.L., et al., *Thin Film Processes II,* Academic Press, Inc., 1–866, (1991).

Wang, K., et al., "Very Low Temperature Deposition of Polycrystalline Silicon Films with Micro–Meter–Order Grains on SiO2", *Mat. Res. Soc. Symp. Proc.,* 355, pp. 581–586, (1995).

Wang, X.W., et al., "Highly Reliable Silicon Nitride Thin Films Made by Jet Vapor Deposition", *Japanese Journal of Applied Physics,* 34, 955–958, (Feb. 1995).

Winters, H.F., et al., "Influence of Surface Absorption Characteristics on Reactivity Sputtered Films Grown in the Biased and Unbiased Modes", *J. Appl. Phys.,* 43(3), pp. 794–799, (1972).

Wolf, S., et al., *Silicon Processing for the VLSI Era, vol. 1—Process Technology,* Lattice Press, Sunset Beach, CA, p. 514–538, (1986).

Yeh, J.L., et al., "Selective Copper plating of Polysilicon Surface Micromachined Structures", *Solid–State Sensor and Actuator Workshop,* pp. 248–251, (1998).

Zhang, J., et al., "Investigations of photo–induced decomposition of palladium acetate for electroless copper plating", *Thin Solid Films,* 318, pp. 234–238, (1998).

Eisenbraun, E.T., et al., "Selective and Blanket Low–Temperature Copper CVD for Multilevel Metallization in ULSI", *Conference Proceedings ULSI–VII,* (1992), pp. 397–401.

Hirao, S., "A Novel Copper Reflow Process Using Dual Wetting Layers", *Symposium on VLSI Technology,* Digest of Technical Papers, (1997), pp. 57–58.

Kaloyeros, A.E., et al., "Blanket and Selective Copper CVD from Cu(FOD)2 for Multilevel Metallization", *Mat. Res. Soc. Symp. Proc.,* vol. 181, (1990), pp. 79–84.

Klaus, J.W., "Atomic Layer Deopsition of Tungsten Nitride Films Using Sequential Surface Reactions", *Journal of the Electrochemical Society,* 147(3), (2000), pp. 1175–1181.

Min, Jae–Sik., "Metal–Organic Atomic–Layer Deposition of Titanium–Silicon–Nitride Films", *Applied Physics Letters,* vol. 75, No. 11, (1999), pp. 1521–1523.

COPPER METALLURGY IN INTEGRATED CIRCUITS

This application is a Divisional of U.S. application Ser. No. 09/128,859, filed Aug. 4, 1998 now U.S. Pat. No. 6,284,656.

FIELD OF THE INVENTION

The present invention concerns methods of fabricating integrated circuits, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together to define a specific electric circuit, such as a computer memory.

Interconnecting millions of microscopic components typically entails covering the components with an insulative layer of silicon dioxide, etching small holes in the insulative layer to expose portions of the components underneath, and digging trenches in the layer to define a wiring pattern. Then, through metallization, the holes and trenches are filled typically with aluminum, to form line-like aluminum wires between the components. The aluminum wires are typically about one micron thick, or about 100 times thinner than a human hair.

Silicon dioxide and aluminum are the most common insulative and conductive materials used to form interconnections today. However, at sub-micron dimensions, that is, dimensions appreciable less than one micron, aluminum and silicon-dioxide interconnection systems present higher electrical resistances and capacitances which waste power and slow down integrated circuits. Moreover, at these smaller dimensions, aluminum exhibits poor electromigration resistance, a phenomenon which promotes disintegration of the aluminum wires at certain current levels. This ultimately undermines reliability, not only because disintegrating wires eventually break electrical connections but also because aluminum diffuses through surrounding silcon-dioxide insulation to form short circuits with neighboring wires. Thus, at submicon dimensions, aluminum and silicon-dioxide interconnection systems waste power, slow down integrated circuits, and compromise reliability.

Copper appears, because of its lower electrical resistivity and higher electromigration resistance to be a promising substitute for aluminum. And, many polymers, for example, fluorinated polyimides, because of their lower dielectric constants, appear to be promising substitutes for silicon dioxide. Thus, a marriage of copper with these polymers promises to yield low-resistance, low-capacitance interconnective structures that will improve the efficiency and speed of integrated circuits.

Unfortunately, copper reacts with these polymers to form conductive copper dioxide within these polymers, reducing their effectiveness as low-capacitance insulators and ultimately leaving the copper-polymer promise of superior efficiency and speed unfulfilled.

SUMMARY OF THE INVENTION

To address these and other needs, the inventor has developed methods of making copper-polymer interconnection systems with reduced copper oxide. Specifically, one method uses a non-acid-based polymeric precursor, such as ester, instead of the typical acid precursor, to form a polymeric layer, and then cures the layer in a reducing or non-oxidizing atmosphere, thereby making the layer resistant to oxidation. Afterward, a zirconium, hafnium, or titanium layer is formed on the polymeric layer to promote adhesion with a subsequent copper layer. With the reduced formation of copper oxide, the method yields faster and more efficient copper-polymer interconnects.

Moreover, reducing copper-dioxidation facilitates micron and sub-micron spacing of polymer-insulated copper conductors, which would otherwise require spacings of 10 or more microns. Accordingly, another aspect of the invention is an integrated circuit including at least two conductors which are separated by no more than about one micron of a polymeric insulator. Thus, the inventor provides a method that not only yields copper-polymer interconnects of superior speed and efficiency, but also yields integrated circuits with unprecedented spacing of copper-polymer interconnects.

BRIEF DESCRIPTION OF THE DRAWINGS

The invention is described with reference to the following figures, wherein like numerals re -like features.

DETAILED DESCRIPTION OF PREFERRED EMBODIMENTS

The following detailed description, which references and incorporates FIGS. 1–11, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
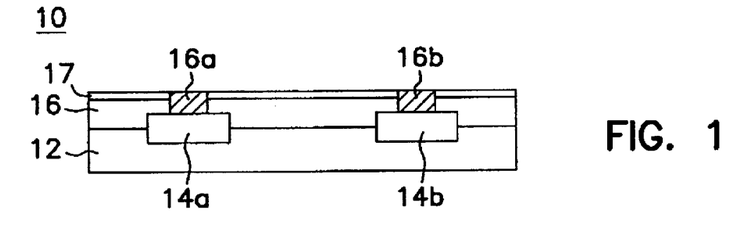
FIG. 1 is a cross-sectional view of an integrated-circuit assembly at an early fabrication stage, including transistors 14a and 14b, an insulative layer 16, contacts 16a and 16b and a silicon nitride layer 17.

FIGS. 1–9 show a number of exemplary integrated-circuit assemblies, which taken collectively and sequentially, illustrate an exemplary method of the present invention. The method, as shown in FIG. 1, a cross-sectional view, begins with a known integrated-circuit assembly or structure 11, which can be within any integrated circuit, an integrated memory circuit, for example. Assembly 11 includes a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

Substrate 12 supports a number of integrated elements 14, such as transistors 14a and 14b. Transistors 14a and 14b are covered by a 100-nanometer-thick, insulative layer 16, which, for example, comprises a silicon oxide. A silicon-nitride layer 17, also 100-nanometers thick, covers layer 16. Extending through layers 16 and 17 are two tungsten vias (or contact plugs) 16a and 16b electrically connected to respective transistors 14a and 14b. Although omitted from FIGS. 1–9 for clarity, assembly 11 preferably includes a titanium-nitride (TiN) diffusion barrier between vias 16a and 16b and transistors 14a and 14b.

Figure 2:
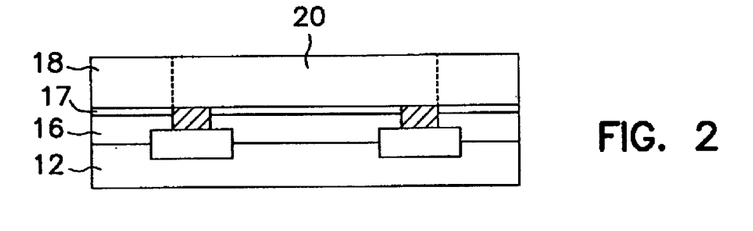
FIG. 2 is a cross-sectional view of the FIG. 1 integrated-circuit assembly after formation of a polymeric layer 18 over contacts 16a and 16b and layer 17 and after formation of a trench 20.

FIG. 2 shows that the first step of the exemplary method entails forming a polymeric layer 18 atop layer 17. As used herein, the term "polymeric" encompasses organic polymers, organic oligomers, and organic monomers. Collectively, these may be described as materials containing one or more mer units having a carbon-chain backbone. In addition, "polymeric" encompasses materials having properties similar to those of organic polymers. For instance, organic polymers characteristically have high ductility, low elastic modulus, low compressive-yield strength, and/or low thermal-expansion coefficients. Moreover, as used herein, polymeric encompasses polymer precursors, or bases.

In the exemplary embodiment, polymeric layer 18 begins as a non-acid polymeric precursor, that is, a precursor with a pH greater than about 6. Examples of polymeric precursors include a polyimide ester, such as the type sold by E. I. du Pont de Nemours under the tradename PI-2801, or a polymeric-precursor derivative based on fluorine, bromine, or other elements from the fluorine periodic group. Other embodiments form polymeric layer 18 as a foamed polymer, which will generally have a lower dielectric constant than most non-foamed polymers and thus provides further capacitance reductions. An example of a foamed polymer is taught in co-pending and co-assigned patent application Ser. No. 08/892,114 filed Jul. 14, 1997. This application, entitled Method of Forming Insulating Material for an Integrated Circuit and Integrated Circuits Resulting from Same, is incorporated herein by reference.

Subsequent to its formation from a non-acid precursor, polymeric layer 18 is cured, with the resultant layer having a thickness of about 500 nanometers. In the exemplary embodiment, the curing procedure has three phases: the first at 125° C. for 15 minutes, the second at 250° C. for 30 minutes, and the third at 375° C. for 30 minutes, with the second and third phases occurring in a non-oxidizing, or reducing, atmosphere to inhibit oxidation. Some exemplary atmospheres are pure hydrogen or mixtures of about 3-to-10% hydrogen with nitrogen, argon, or helium. Starting with the non-acid precursor and curing according to this procedure ultimately reduces the amount of oxidization that occurs in subsequent processing by about four fold. Therefore, unlike conventional polymeric processing, this procedure prevents or reduces increases in the dielectric constant of polymeric layer 18.

Figure 3:
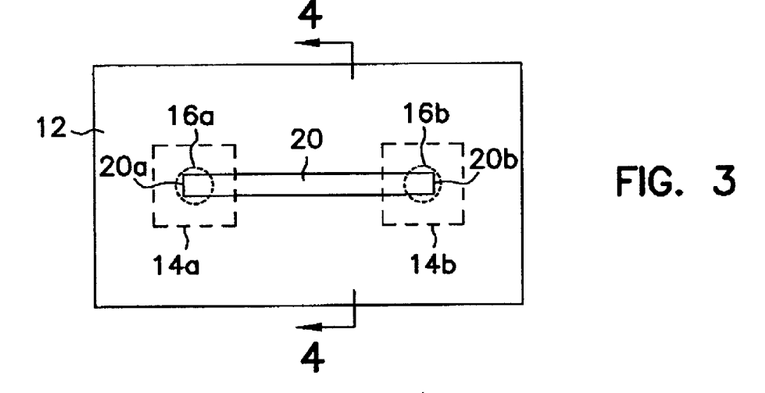
FIG. 3 is a top view of the FIG. 2 integrated-circuit assembly, showing position of the trench relative contacts 16a and 16b.
Figure 4:
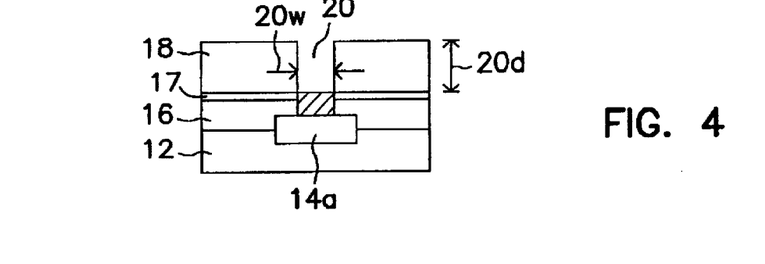
FIG. 4 is another cross-sectional view of the FIG. 3 integrated-circuit assembly, taken along line 4—4 to show depth and width of the trench.

The next step, best illustrated in FIG. 3, a top view of the FIG. 2 assembly, is to define the stud and wiring patterns on layer 18, using for example suitable masking and etching techniques. In the exemplary embodiment, this entails using reactive-ion etching or any selective-material-removal technique to form a trench 20, which will ultimately define a conductor for connecting vias 16a and 16b. FIG. 3 shows that trench 20 has ends 20a and 20b which correspond with respective vias 16a and 16b. FIG. 4, a cross-section of assembly 11 taken along line 4—4 in FIG. 3, shows that trench 20 has a depth 20d of about 500 nanometers to expose vias 16a and 16b, and a width 20w of about 250 nanometers. Thus, in this exemplary embodiment, trench 20 has an approximate aspect ratio of 2-to-1.

Figure 5:
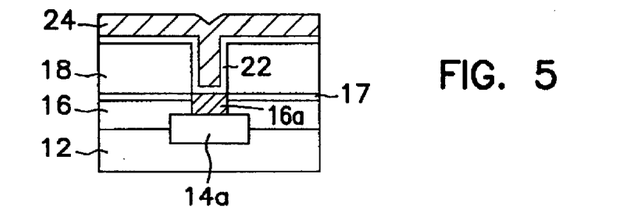
FIG. 5 is a cross-sectional view of the FIG. 4 assembly after formation of a copper-adhesion layer 22 and a copper layer 24.

The next step, shown in FIG. 5, entails applying a 10-nanometer-thick adhesion layer 22 on layer 18, inside and outside trench 20. The principle purpose of the adhesion layer, which may also be called a seed, contact, or cladding layer, is to promote adherence of a copper layer formed in the next step. Examples of suitable adhesion-layer materials include zirconium, hafnium, titanium. Zirconium, however, is preferable to titanium since it has at least a ten-fold lower solubility in copper.

Next, to form a copper conductor, the method fills trench 20, as FIG. 5 shows, by depositing a 975-nanometer-thick copper layer 24 on layer 22 and inside trench 20. In some embodiments another 10-nanometer-thick adhesion layer is formed atop copper layer 24 to inhibit copper oxidation during later processing, particularly during curing of subsequent polymeric layers. To reduce copper oxidation, one embodiment performs the adhesion-material and the copper deposition at temperatures less than 450° C., another embodiment at temperatures between about 250 and 350° C., and another at around 300° C.

In the 250–350° C. range, a thin layer of $Cu_5Zr$ (or Beta), tends to initially form at the interface of the copper and zirconium layers, inhibiting diffusion of zirconium into the copper and preventing it from significantly increasing resistance of the copper. A similar effect may be achieved by electroplating the copper and heat-treating the zirconium and copper layers at 250–350° C. for one to two hours, before curing the polymer. Inhibiting the diffusion of zirconium into the copper ultimately yields a copper conductor with a conductivity greater than 95 percent of IACS, or International Annealed Copper Standard. The International Annealed Copper Standard (IACS) is 1.7241 microhm-centimeters at 20 C, or 17.241 nanaohm-meters. Thus, the exemplary copper conductor has a conductivity greater than about 16.4 nanaohm-meters. However, in other embodiments the conductor is in the range of 14 nanohm-meters or greater.

Figure 6:
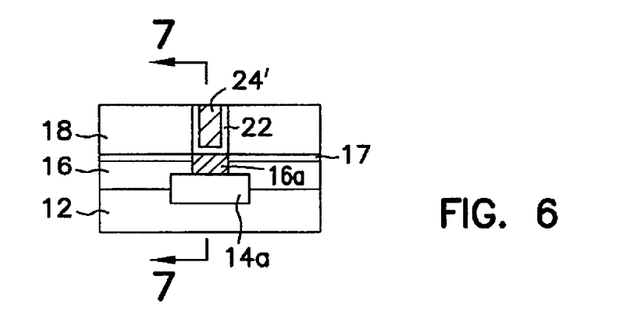
FIG. 6 is a cross-sectional view of the FIG. 5 assembly after removal of excess portions of layers 22 and 24 leaves copper conductor 24'.

Afterwards, excess copper and zirconium on the surface are then removed using a chemical-mechanical polishing technique. FIG. 6 shows the resulting metal conductor 24', which electrically connects vias 16a and 16b and therefore connects transistors 14a and 14b. Formation of conductor 24' completes the first level of metallization.

Figure 7:
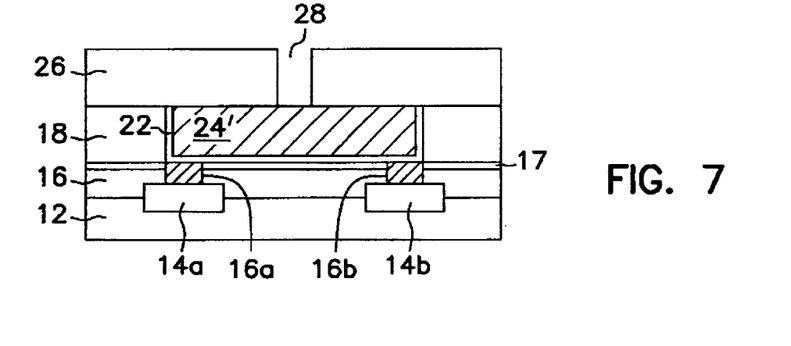
FIG. 7 is a cross-sectional view of the FIG. 6 assembly taken along line 7—7 after formation of another polymeric layer 26 having a via hole 28.

FIG. 7 shows that the second level metallization starts with formation and curing of a second polymeric layer 28 on layer 22. In some embodiments, layer 28 has a composition similar to polymeric layer 18. Subsequently, the method cures layer 28, again following a three-phase curing procedure with temperatures similar to those used for layer 18. The first phase preferably occurs in hydrogen, high-purity forming gas, or a non-oxidizing high-purity argon, and the second and third phases preferably occur in a non-oxidizing atmosphere of high-purity argon. In contrast to conventional curing procedures, this curing procedure, devised primarily for second and subsequent polymeric layers, takes particular care to avoid inciting reactions with and between existing polymeric and copper structures, for example, layer 18 and conductor 24'. Therefore, this procedure safeguards the dielectric strength of polymeric layer 18.

Figure 8:
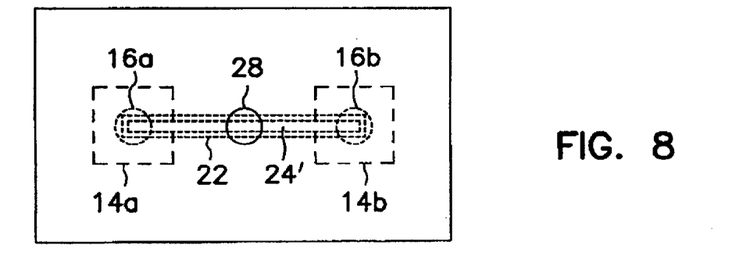
FIG. 8 is a top view of the FIG. 7 assembly, showing position of the via hole relative conductor 24'.

After curing polymeric layer 28, the method defines a stud and/or wiring pattern using any suitable technique. The exemplary embodiment defines a vertical stud, or via, hole 28a in layer 28, using masking and etching techniques. (Hole 28a may also be viewed as the cross-section of a trench, defining a wire that intersects, or contacts, copper conductor 24' which lies below.) Other embodiments form hole 28a along with other wiring trenches similar to trench 20, according to conventional dual-damascene techniques, which fill via holes and trenches in one metallization. FIG. 8 shows the position of hole 28a relative transistors 14a and 14b, vias 16a and 16b, and conductor 24' from the first metallization level.

The next steps form a 10-nanometer-thick adhesion layer 30, similar to adhesion layer 22, on polymeric layer 28, as well as a copper layer 32 on layer 28. (Other embodiments form an additional adhesion layer on copper layer 32.) Layers 30 and 32, in the exemplary embodiment, are deposited at approximately 300° C. As already noted, depositing zirconium and copper at this temperature tends to form a thin interfacial layer of $Cu_5Zr$ (not shown) between layers 30 and 32, which ultimately enhances conductivity of the resulting conductor. Subsequent annealing also promotes formation of this interfacial layer.

Figure 9:
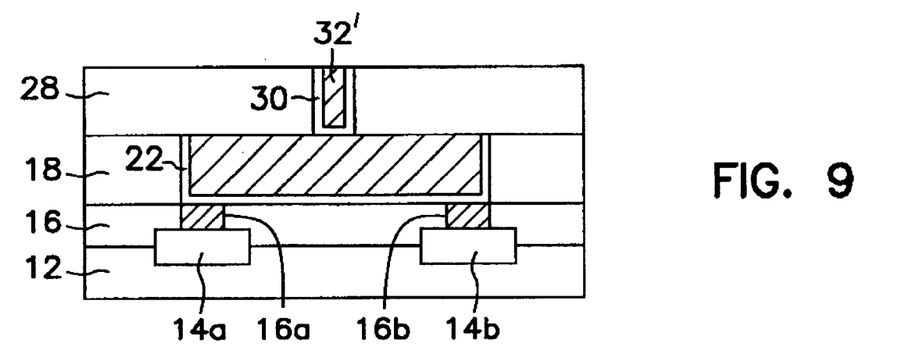
FIG. 9 is a cross-sectional view of the FIG. 8 assembly after formation of a copper-adhesion layer 30 and copper contact 32.

After completion of layer 32, excess copper and adhesion-layer material are removed, for example, by chemical-mechanical polishing. FIG. 9 shows that the resulting integrated-circuit assembly includes a copper via 34' electrically connected to underlying conductor 24' and thus also connected to transistors 14a and 14b. Subsequent metallizations would follow similarly.

Figure 10:
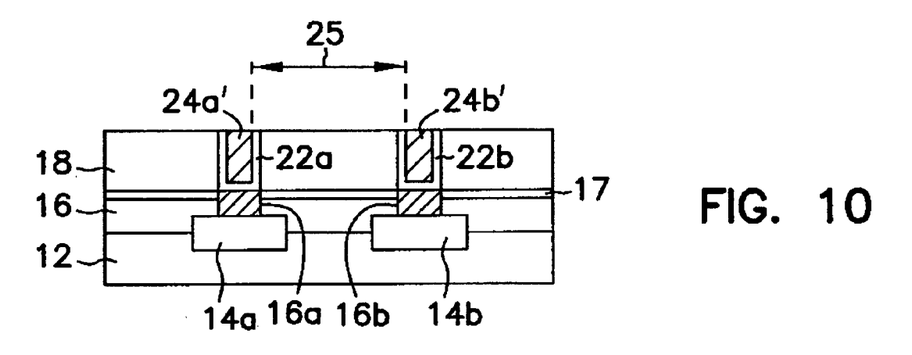
FIG. 10 is a cross-sectional view of an integrated-circuit assembly having two copper conductors 24a' and 24b' in a polymeric insulator 18, with the conductors separated by no more than about one micron.

In addition to preservation of the dielectric constant of the polymeric layers, the oxidation reductions stemming from the present invention also allow closer spacing of copper conductors in polymeric insulators, particularly micron and sub-micron spacing. FIG. 10, a juxtaposition of two of the assemblies shown in FIG. 6, shows two side-by-side copper structures (for example contact plugs or wires) 24a' and 24b' separated by a distance 25 which is less than about one micron in one embodiment. In various embodiments, distance 25 is less than about 0.75 microns, less than about 0.5 microns, or less than about 0.25 microns. In contrast, conventional techniques for forming copper-polymer interconnections require intrapolymer conductor spacings of 20 or more microns to maintain isolation of the conductors after uninhibited formation of conductive copper dioxide in the polymer between conductors. Thus, the micron and submicron spacings of the present invention provide a dramatic improvement.

Figure 11:
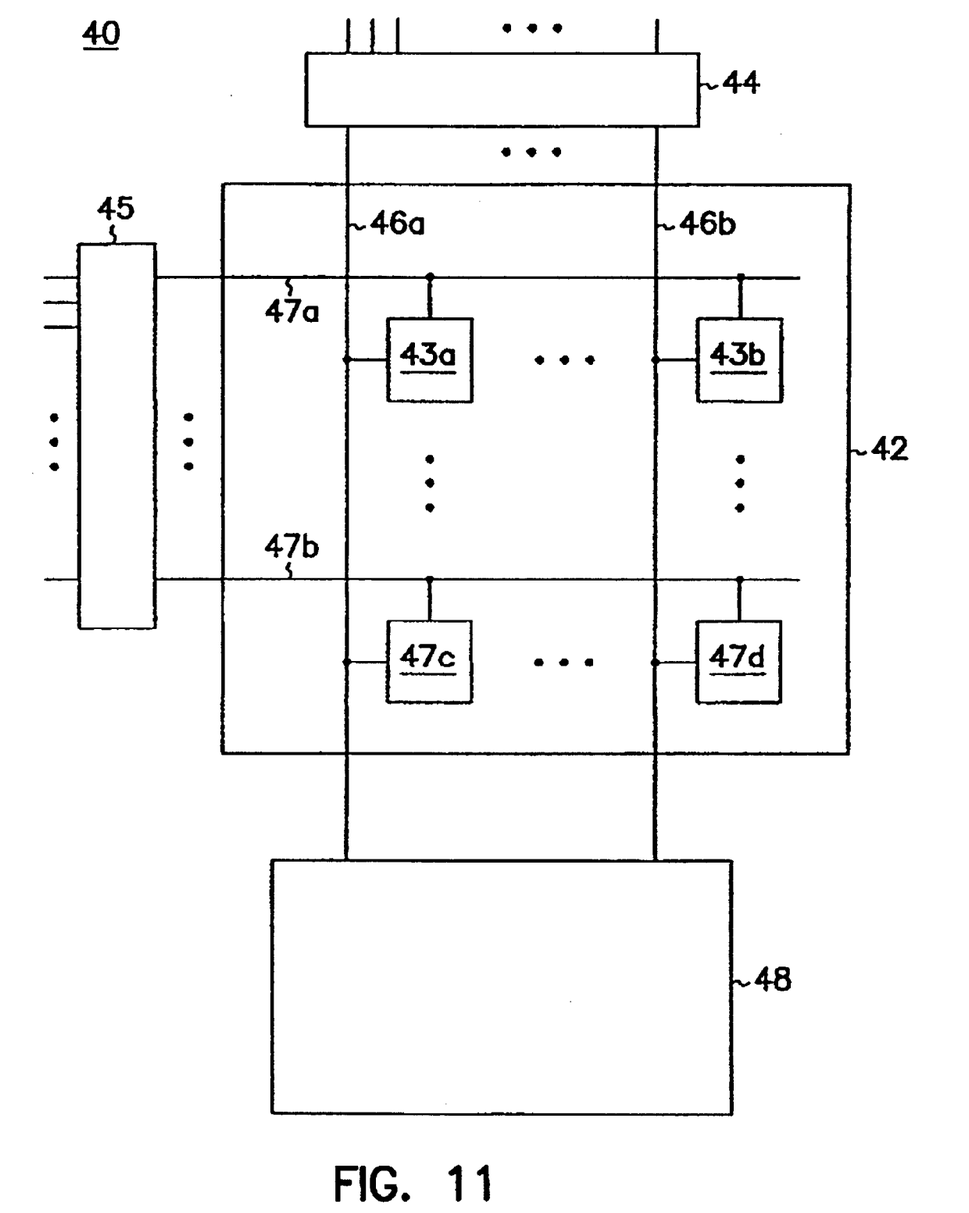
FIG. 11 is a block diagram of an integrated memory circuit which incorporates the present invention.

Exemplary Embodiment of an Integrated Memory-Circuit Incorporating the Copper-Polymer Interconnection System FIG. 11 shows one example of the unlimited number of applications for the copper-polymer interconnections of the present invention: a generic integrated memory circuit 40. Circuit 40, which operates according to well-known and understood principles, is generally coupled to a processor (not shown) to form a computer system. More precisely, circuit 40 includes a memory array 42 which comprises a number of memory cells 43, a column address decoder 44, and a row address decoder 45, bit lines 46, word lines 47, and voltage-sense-amplifier circuit 48 coupled to bit lines 46.

In the exemplary embodiment, each of the memory cells, the address decoders, and the amplifier circuit includes two or more zirconium-clad copper conductors embedded in polymeric insulation according to the present invention. In addition, connections between the address decoders, the memory array, the amplifier circuit are implemented using similar copper-polymer interconnects. The spacings of these conductors, in some embodiments, follow the micron and submicron spacings noted for FIG. 10.

CONCLUSION

The present invention provides a method of forming copper-polymer interconnections systems, which reduces the tendency of polymers to react with copper and form undesirable copper oxides. Formation of these copper oxides would otherwise reduce the effectiveness of the polymers as low-capacitance insulators and thus offset their ability to improve speed and efficiency of integrated circuits. Thus, the present invention ultimately facilitates the fabrication of integrated circuits having superior speed and efficiency. Moreover, because the reduction in oxidation allows closer placement of polymer-insulated copper wires, the invention also facilitates denser integrated circuits, that is, circuits with greater numbers of components in the same space.

The embodiments described above are intended only to illustrate and teach one or more ways of practicing or implementing the present invention, not to restrict its breadth or scope. The actual scope of the invention, which encompasses all ways of practicing or implementing the invention, is defined only by the following claims and their equivalents.

What is claimed is:

1. An integrated circuit comprising:
   a polymeric insulator having at least first and second trenches, with each trench lined with a copper-adhesion material and having a bottom surface;
   at least first and second copper structures within the first and second trenches, the copper structures including respective first and second portions that are separated by more than one micron, and respective first and second top surfaces that face away from the bottom surfaces of their respective trenches; and
   a copper-adhesion layer at least partially covering the first and second top surfaces of the copper structures.

2. The integrated circuit of claim 1 wherein at least one of the two copper structures is at least partially clad with zirconium.

3. The integrated circuit of claim 1, wherein the polymeric insulator comprises a foamed polymer.

4. The integrated circuit of claim 3, wherein the polymeric insulator is a non-acid-based polymeric insulator.

5. An integrated circuit comprising:
   a polymeric insulator having a trench, with the trench at least partially lined with zirconium and having a bottom surface;
   a copper structure within the trench, the copper structure having a top surfaces that face away from the bottom surface of the trench and a conductivity that is at least as great as 90 percent of the International Annealed Copper Standard; and a zirconium layer at least partially covering the top surface of the copper structure.

6. The integrated circuit of claim 5, wherein the polymeric insulator consists essentially of a foamed polymer.

7. The integrated circuit of claim 6, wherein the polymeric insulator is a non-acid-based polymeric insulator.

8. An integrated circuit comprising:

a polymeric insulator having a trench, with the trench at least partially lined with zirconium and having a bottom surface;

a copper structure within the trench, the copper structure having a top surfaces that face away from the bottom surface of the trench;

a layer of $Cu_5Zr$ between at least a portion of the copper structure and the zirconium lining the trench; and a zirconium layer at least partially covering the top surface of the copper structure.

9. The integrated circuit of claim 8, wherein the polymeric insulator comprises a foamed polymer.

10. The integrated circuit of claim 9, wherein the polymeric insulator is a non-acid-based polymeric insulator.

11. An integrated memory circuit comprising:

a polymeric insulator having at least first and second trenches, with each trench lined with a copper-adhesion material and having a bottom surface;

at least first and second copper structures within the first and second trenches, the copper structures including respective first and second portions that are separated by more than one micron, and respective first and second top surfaces that face away from the bottom surfaces of their respective trenches; and a copper-adhesion layer at least partially covering the first and second top surfaces of the copper structures.

12. The integrated memory circuit of claim 11, wherein the polymeric insulator comprises a foamed polymer.

13. The integrated memory circuit of claim 12, wherein the polymeric insulator is a non-acid-based polymeric insulator.

14. An integrated memory circuit comprising:

a polymeric insulator having a trench, with the trench at least partially lined with zirconium and having a bottom surface;

a copper structure within the trench, the copper structure having a top surfaces that face away from the bottom surface of the trench and a conductivity that is at least as great as 95 percent of the International Annealed Copper Standard; and a zirconium layer at least partially covering the top surface of the copper structure.

15. The integrated memory circuit of claim 14, wherein polymeric insulator comprises a foamed polymer.

16. The integrated memory circuit of claim 15, wherein the polymeric insulator is a non-acid-based polymeric insulator.

17. An integrated memory circuit comprising:

a polymeric insulator having a trench, with the trench at least partially lined with zirconium and having a bottom surface;

a copper structure within the trench, the copper structure having a top surfaces that face away from the bottom surface of the trench;

a layer of $Cu_5Zr$ between at least a portion of the copper structure and the zirconium lining the trench; and a zirconium layer at least partially covering the top surface of the copper structure.

18. The integrated memory circuit of claim 17, wherein polymeric insulator comprises a foamed polymer.

19. The integrated memory circuit of claim 18, wherein the polymeric insulator is a non-acid-based polymeric insulator.

20. A system comprising:

a processor; and an integrated memory circuit coupled to the processor, with the memory circuit comprising:

a polymeric insulator having at least first and second trenches, with each trench lined with a copper-adhesion material and having a bottom surface;

at least first and second copper structures within the first and second trenches, the copper structures including respective first and second portions that are separated by more than one micron, and respective first and second top surfaces that face away from the bottom surfaces of their respective trenches; and a copper-adhesion layer at least partially covering the first and second top surfaces of the copper structures.

21. The integrated memory circuit of claim 20, wherein polymeric insulator comprises a foamed polymer.

22. The integrated memory circuit of claim 21, wherein the polymeric insulator is a non-acid-based polymeric insulator.

23. A system comprising:

a processor; and an integrated memory circuit coupled to the processor, with the memory circuit comprising:

a polymeric insulator having a trench, with the trench at least partially lined with zirconium and having a bottom surface;

a copper structure within the trench, the copper structure having a top surfaces that face away from the bottom surface of the trench and a conductivity that is at least as great as 95 percent of the International Annealed Copper Standard; and a zirconium layer at least partially covering the top surface of the copper structure.

24. The integrated memory circuit of claim 23, wherein polymeric insulator comprises a foamed polymer.

25. The integrated memory circuit of claim 24, wherein the polymeric insulator is a non-acid-based polymeric insulator.

* * * * *

UNITED STATES PATENT AND TRADEMARK OFFICE
CERTIFICATE OF CORRECTION

PATENT NO. : 6,614,099 B2
DATED : September 2, 2003
INVENTOR(S) : Paul A. Farrar It is certified that error appears in the above-identified patent and that said Letters Patent is hereby corrected as shown below:

Title page,
Item [56], References Cited, U.S. PATENT DOCUMENTS, after "5,354,712 A" reference, insert the following:

-- 5,371,042    12/1994    Ong ..................... 438/653 --
"6,211,073 B1" reference, delete "et al." after "Ahn".

Column 2,
Line 26, delete "re -like" and insert -- refer to like -- therefor.

Column 6,
Line 50, insert -- no -- before "more".

Column 7,
Line 33, insert -- no -- before "more".

Column 8,
Line 29, insert -- no -- before "more".

Signed and Sealed this

Tenth Day of February, 2004

JON W. DUDAS
*Acting Director of the United States Patent and Trademark Office*